(12) United States Patent  
Asada

(10) Patent No.: US 7,859,643 B2  
(45) Date of Patent: Dec. 28, 2010

(54) APPARATUS FOR MOVING CURVED-SURFACE MIRROR, EXPOSURE APPARATUS AND DEVICE MANUFACTURING METHOD

(75) Inventor: Katsumi Asada, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 360 days.

(21) Appl. No.: 11/877,147

(22) Filed: Oct. 23, 2007

(65) Prior Publication Data

US 2008/0100894 A1 May 1, 2008

(30) Foreign Application Priority Data

Oct. 27, 2006 (JP) ............... 2006-293153

(51) Int. Cl.
*G03B 27/42* (2006.01)
*G03B 27/68* (2006.01)
*G02B 7/02* (2006.01)

(52) U.S. Cl. ............... 355/53; 355/52; 359/811

(58) Field of Classification Search .......... 355/52, 355/53, 55, 67; 359/811–820
See application file for complete search history.

(56) References Cited

U.S. PATENT DOCUMENTS 6,842,277 B2 * 1/2005 Watson ............... 359/291
7,151,588 B2 * 12/2006 Franken et al. ............... 355/30
7,154,684 B2    12/2006 Shibazaki
7,603,010 B2 *  10/2009 Kwan et al. ............... 385/52
2006/0232866 A1 10/2006 Sai et al. ............... 359/849
2007/0121224 A1  5/2007 Shibazaki

FOREIGN PATENT DOCUMENTS

JP   2002-131605    5/2002
JP   2004-64076     2/2004

* cited by examiner

*Primary Examiner*—Hung Henry Nguyen
(74) *Attorney, Agent, or Firm*—Fitzpatrick, Cella, Harper & Scinto

(57) ABSTRACT

An apparatus for moving a spherical mirror in which at least three actuators move the spherical mirror, at least five position sensors sense the position of the spherical mirror, and a controller calculates coordinates of a center of curvature of the spherical mirror with three-degrees-of-freedom, based on positions sensed by the at least five position sensors. The controller controls driving of the at least three actuators in accordance with a difference between the calculated coordinates and predetermined coordinates, so that the center of curvature of the spherical mirror is held fixed to the predetermined coordinates.

9 Claims, 7 Drawing Sheets

APPARATUS FOR MOVING CURVED-SURFACE MIRROR, EXPOSURE APPARATUS AND DEVICE MANUFACTURING METHOD

This application claims the benefit of Japanese Patent Application No. 2006-239153, filed Oct. 27, 2006, which is hereby incorporated by reference herein in its entirety.

BACKGROUND OF THE INVENTION

1. Field of the Invention

The present invention relates to an apparatus for moving a curved-surface minor.

2. Description of the Related Art

An exposure apparatus is used in a photolithographic process for the manufacture of a semiconductor element, to expose the circuit pattern of a reticle, and to transfer the pattern to a silicon wafer, by way of example. Owing to a demand for higher integration of semiconductor elements, step-and-scan exposure systems now dominate and have supplanted the conventional step-and-repeat exposure systems. A step-and-scan exposure apparatus is a scanning exposure apparatus in which slit-shaped illuminating light is partially emitted from one end of a reticle, and the entirety of a circuit pattern is exposed on a wafer (substrate) via a projection optical system, while a reticle stage holding the reticle and a wafer stage holding the wafer, are driven synchronously.

In an exposure apparatus of this kind, the resolution of the projection optical system has been improved in order to expose and to transfer a fine pattern accurately. For example, the apparatus naturally is designed in order to enlarge the numerical aperture (NA) of the optical system and to reduce optical aberration, and manufacture, assembly and adjustment, employing highly sophisticated measurements, have been carried out. Furthermore, it is desired that various optical characteristics (e.g., magnification, distortion and focus) be adjustable during the exposure operation. In addition, it is necessary that the effects of disturbance (e.g., fluctuations in air pressure, fluctuations in temperature and humidity, floor vibration and aging) be eliminated, to a maximum degree, in order to achieve stable performance. In order to realize these functions, the positions, attitudes and deformations of the optical elements (e.g., lenses, mirror and prisms) that construct the projection optical system should be adjusted during the exposure operation.

A variety of types of optical element driving apparatuses have been developed from this standpoint. For example, the specification of Japanese Patent Laid-Open No. 2002-131605 discloses an optical element driving apparatus, in which the optical elements are capable of being driven through six-degrees-of-freedom of motion.

Further, the specification of Japanese Patent Laid-Open No. 2004-064076 discloses an optical element driving apparatus, in which a number of focus actuators are deployed on the underside of a mirror, to adjust the shape of the reflective surface of the mirror, and position sensors are provided to enable adjustment of rotation about the direction of the optical axis and two other directions that form an orthogonal system with the direction of the optical axis.

In general, if the number of drivable optical elements or number of degrees of freedom of motion is increased, the optical characteristics of a projection optical system can be adjusted to more preferable characteristics. However, unless other components and displacement errors can be sufficiently suppressed, with respect to drive in a desired direction and drive displacement, optical characteristics will worsen instead. This manifests itself, in particular, when adjusting and driving a mirror, the optical sensitivity of which is greater than that of a lens. Further, if the rigidity of the mechanism declines, owing to an increase in degrees of freedom of drive, positional deviation may increase, owing to disturbances, even if it is possible to adjust the drive to the desired position, and optical characteristics may worsen. For these reasons, it is required that driving of the mirror be executed by a driving apparatus having highly sophisticated mechanical and control systems.

SUMMARY OF THE INVENTION

The present invention has been made in light of the foregoing background. It is an object of the present invention, for example, to precisely adjust the position of a curved surface minor.

According to one aspect of the present invention, an apparatus for moving a curved-surface minor is provided. The apparatus includes at least three actuators configured to move the curved-surface mirror, at least five position sensors configured to sense the position of the curved-surface mirror, and a controller configured to calculate coordinates of a center of curvature of the curved-surface mirror, with three-degrees-of-freedom, based on positions sensed by the at least five position sensors, and to control driving of the at least three actuators in accordance with a difference between the calculated coordinates and predetermined coordinates.

Further features of the present invention will become apparent from the following description of exemplary embodiments, with reference to the attached drawings.

DESCRIPTION OF THE EMBODIMENTS

Various exemplary embodiments, features and aspects of the present invention will be described in detail below, with reference to the drawings.

Embodiment 1

Figure 1:
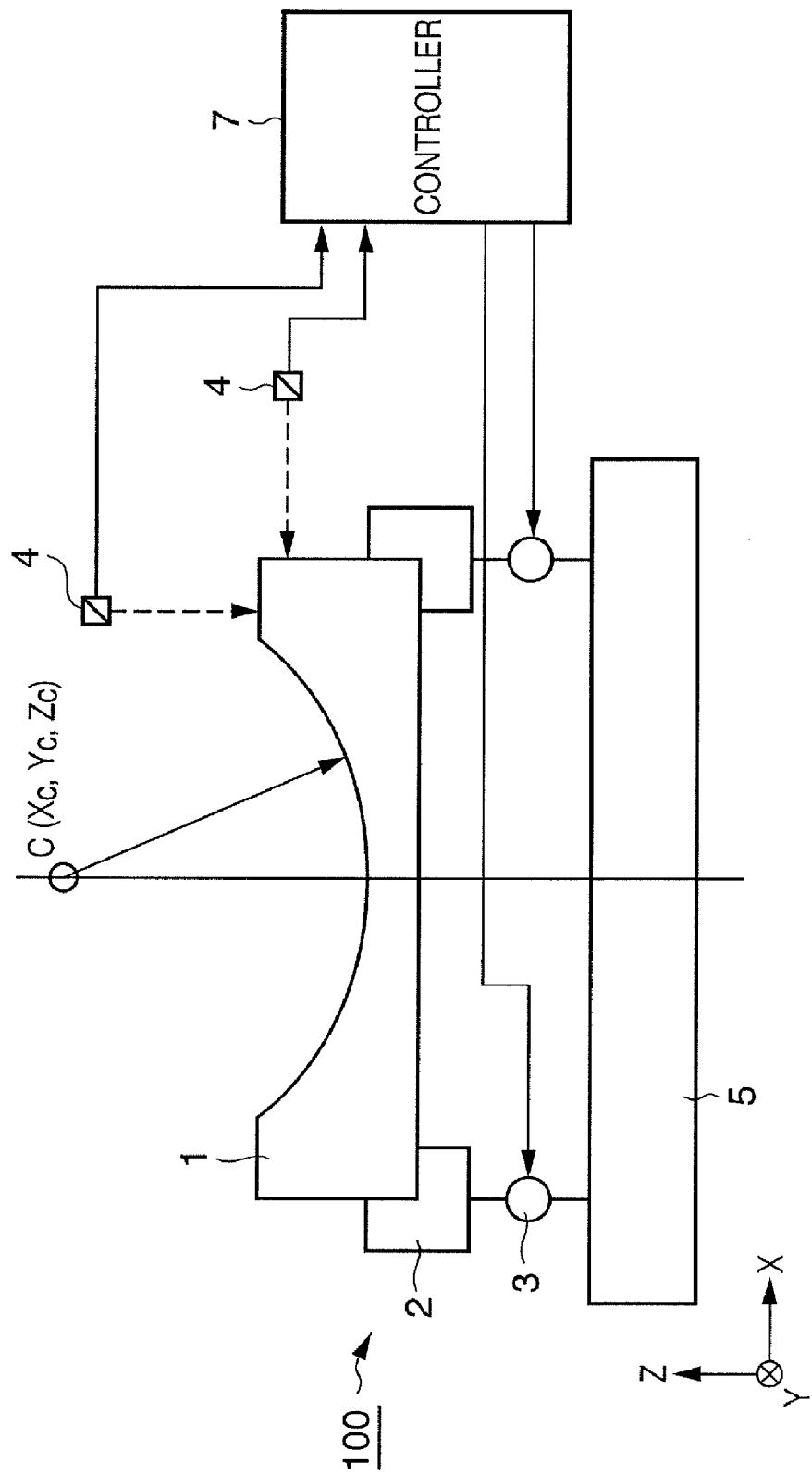
FIG. 1 is a diagram illustrating the structure of an optical element driving apparatus according to an embodiment of the present invention.
Figure 2:
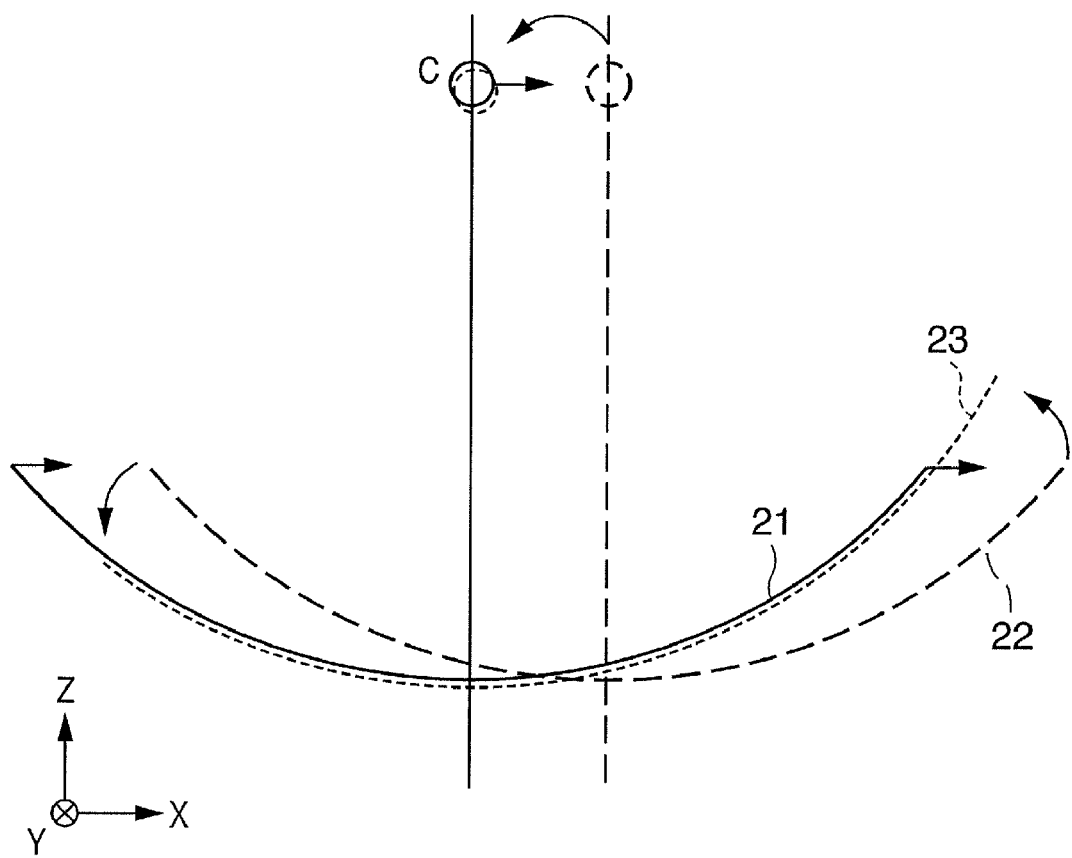
FIG. 2 is a diagram useful in describing translation displacement and inclination displacement of a curved-surface mirror, with respect to the optical axis.

FIG. 1 is a diagram illustrating the structure of an optical element driving apparatus 100 according to this embodiment. As shown in FIG. 1, a curved-surface minor 1, which serves as an optical element, has a curved reflective surface. A typical example of a minor, used as the curved-surface minor 1, is a spherical minor having a reflective surface that defines a spherically concave surface. Let the direction of the optical axis be the Z axis, let two other directions forming a rectangular coordinate system with this axis be X and Y axes, and let the six-degrees-of-freedom of the curved-surface minor 1 be translations X, Y, Z and rotations θx, θy, θz, respectively, about these axes. Further, let C be the center of curvature of the curved-surface minor 1, and let C(Xc, Yc, Zc) represent the coordinates of the center of curvature. Further, let (ΔXc, ΔYc, ΔZc) represent a change in this position.

A minor support plate 2 supports the curved-surface minor 1. Three or more actuators 3 for driving the minor support plate 2 are deployed in order to make it possible to adjust three-degrees-of-freedom, namely, along the direction of the optical axis Z of curved-surface minor 1, and in the θx, θy directions. Examples of the actuators 3 include pneumatic bellows, linear motors, electromagnets, piezoelectric elements, magnetorestrictive elements, piezoelectric thin films formed as an integral part of the curved-surface minor 1, or compression/decompression chambers formed in the material of the curved-surface minor as an integral part thereof.

A position sensor 4 is provided for measuring the position of the curved-surface minor 1. In order to determine the position and attitude (Xm, Ym, Zm, θxm, θym, θzm) of the curved-surface minor 1 through six-degrees-of-freedom, position sensors 4 are deployed so as to detect at least six points on the curved-surface minor 1. Alternatively, if the reflective surface of the minor has rotational symmetry with regard to the optical axis and the θzm value is unnecessary, then five or more position sensors will suffice. Examples of the position sensors are an electrostatic capacitance sensor (electrostatic capacity sensor), a laser interferometer and a wavefront sensor, such as a Shack-Hartmann sensor. Reference numeral 5 denotes the base of the overall apparatus. A controller 7 controls the driving of the actuators 3 based upon results of sensing by the position sensors 4. A typical example of the controller 7 is a computer device comprising a CPU, a RAM and a ROM, etc., (none of which are shown).

This fact indicates that if at least the position C(Xc, Yc, Zc) of the center of curvature of curved-surface minor 1 can be held fixed, then, the optical characteristics can be held constant. The operation that holds fixed the position of the center of curvature can be executed even by a driving mechanism having the three-degrees-of-freedom X, θx, θy and not the degrees-of-freedom in the horizontal directions X and Y. That is, it will suffice to construct a control system that compensates for a shift in the center of curvature in the X and Y directions by driving about the angles of rotation θy, θx.

Figure 3:
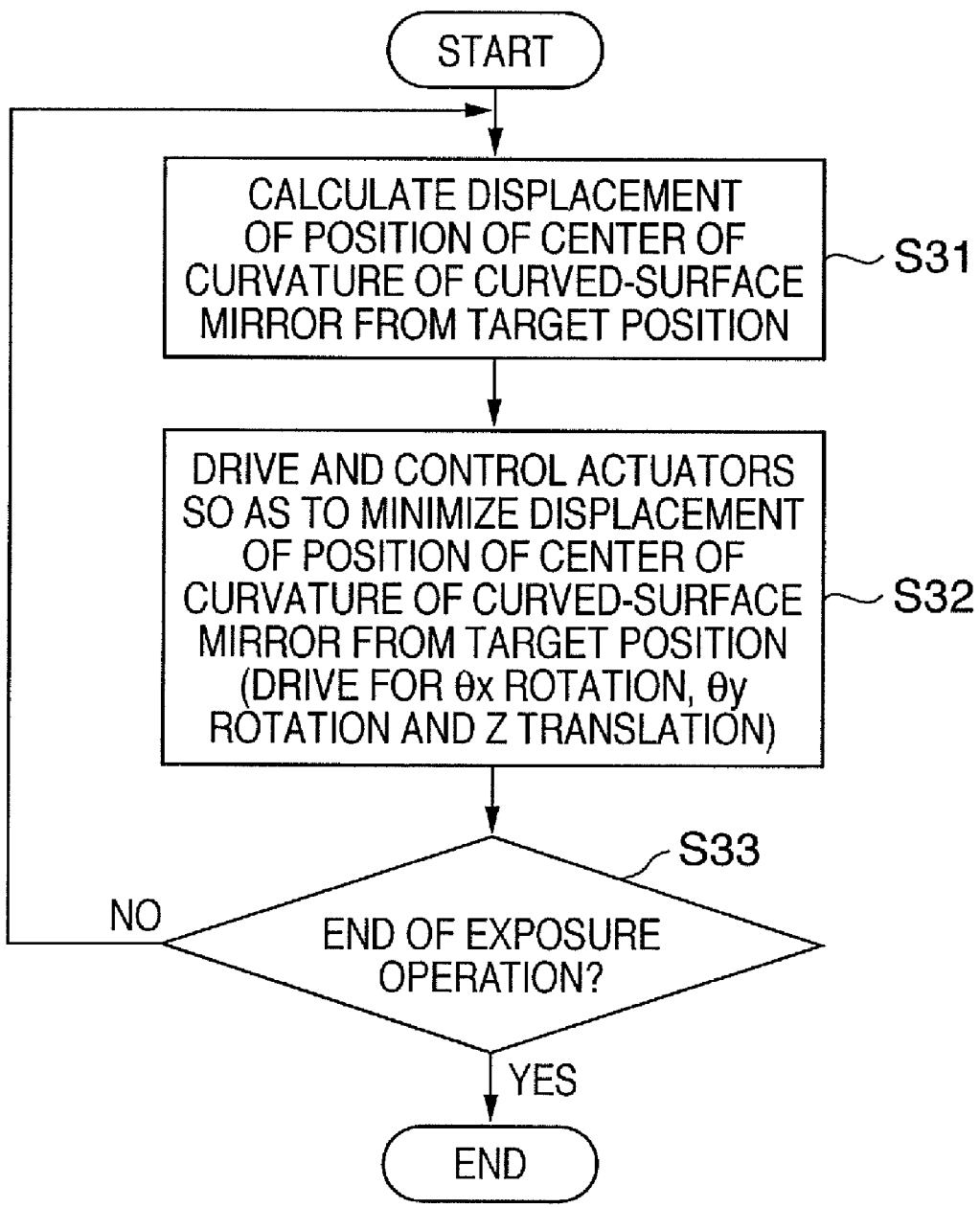
FIG. 3 is a flowchart illustrating a procedure for controlling drive of actuators executed by a controller in an embodiment.
Figure 4:
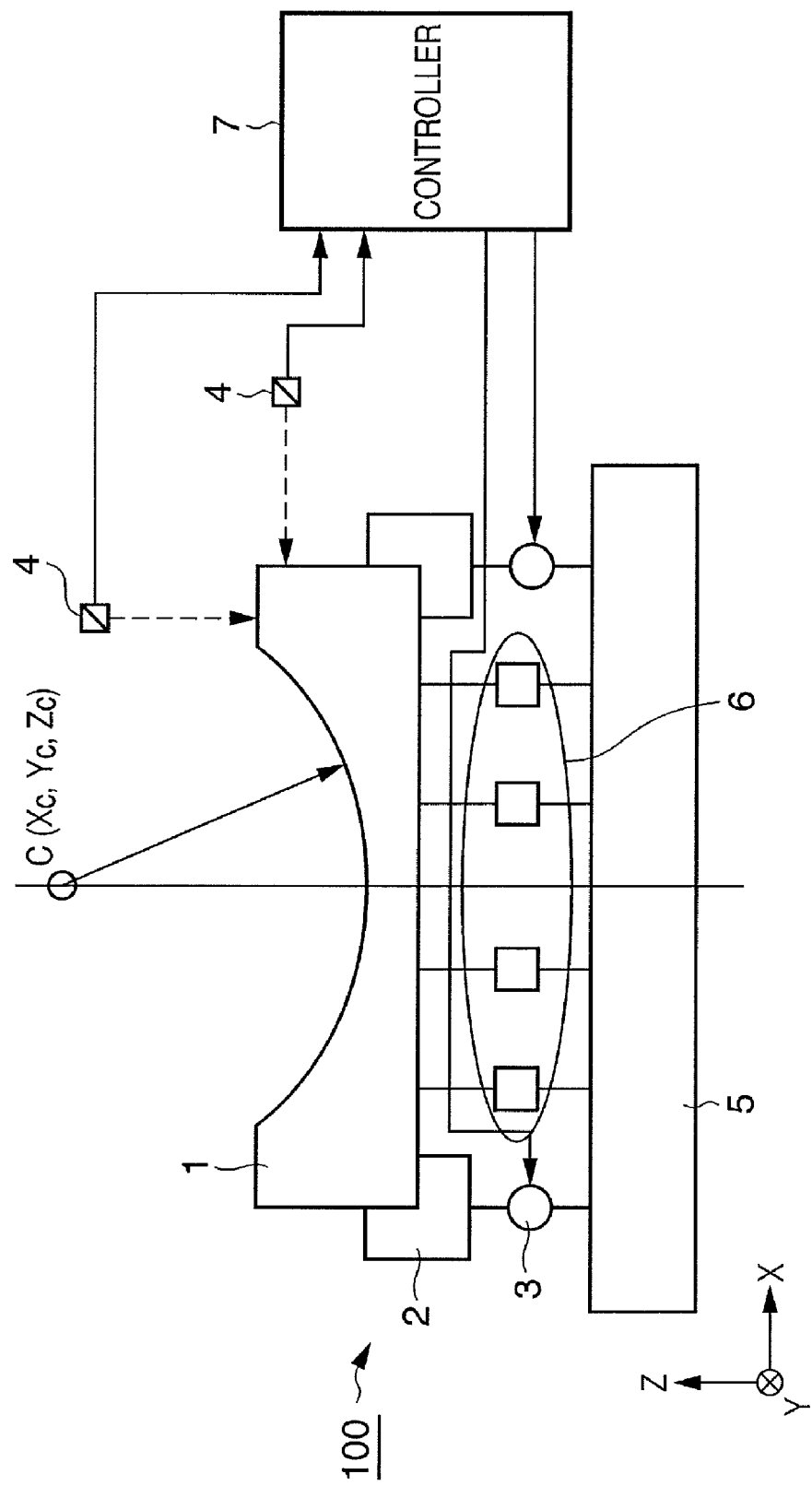
FIG. 4 is a diagram illustrating the structure of an optical element driving apparatus according to a fifth embodiment of the present invention.

Operation of the optical element driving apparatus of FIG. 1 will now be described, with reference to the flowchart of FIG. 3. FIG. 3 is a flowchart illustrating a procedure for controlling drive of the actuators 3 executed by the controller 7.

If the curved-surface mirror 1 is shifted along the X direction owing to a disturbance, or the like, naturally, the position C of the center of curvature of the mirror also is similarly shifted along the X direction. Fluctuations (ΔXm, ΔYm, ΔZm, Δθxm, Δθym, Δθzm) in position and attitude of the curved-surface minor 1 through six-degrees-of-freedom are calculated by a coordinate transformation from the values detected by the position sensors 4 that measure six or more points on the curved-surface mirror 1. As an operation that is a characterizing feature of this embodiment, displacement (ΔXc, ΔYc, ΔZc) of the position C of the center of the curvature of curved-surface mirror 1 (referred to simply as "fluctuation" below) from a target position is calculated by a coordinate transformation from the position and attitude of the curved-surface mirror 1 through six-degrees-of-freedom.

It should be noted that the fluctuation in the position C of the center of curvature may be calculated directly from measurement values of the position sensors 4 upon combining these two coordinate transformations (step S31).

Next, the actuators 3 are drive and controlled so as to compensate for fluctuation in the position C of the center of curvature by rotating ΔXc through θy and rotating ΔYc through θx. Further, the actuators 3 are driven and controlled so as to compensate for fluctuation in the position C of the center of curvature by a Z translation, with regard to ΔZc (step S32). More specifically, the actuators 3 are driven and controlled so as to minimize the fluctuation in the position C of the center of curvature of curved-surface mirror, by way of example.

In a case when the optical element driving apparatus in this embodiment is applied to an exposure apparatus (see the seventh embodiment, described later), the above-mentioned control processing (steps S32 and S33) is executed during the exposure operation, and the control processing ends with the end of the exposure operation (step S33).

By virtue of the above-described processing, the position C of the center of curvature of curved-surface mirror 1 is held fixed, even if the position of the curved-surface mirror 1 fluctuates owing to disturbance, etc., and, therefore, the optical characteristics can be held constant.

It should be noted that the scope of application of the technique of this embodiment for controlling the position C of the center of curvature of curved-surface mirror 1 is not limited solely to a case in which it is desired to restore the position of the curved-surface mirror 1, which has fluctuated owing to a disturbance, etc., to the original position. For example, in a case when it is desired to move the position C of the center of curvature to a desired target position (e.g., by 10 nm along the +Z direction) in order, for example, to achieve an adjustment to more desirable optical characteristics, the curved-surface mirror 1 and the center of curvature thereof shift horizontally, in the X and Y directions, owing to other driving components. In this case, also, in accordance with the control technique described above, the actuators 3 can be driven and controlled, so as to compensate for the shift horizontally in the X and Y directions by θy and θx rotations. Alternatively, even in a case when it is desired to shift the position C of the center of curvature horizontally, the position C of the center of curvature can also be shifted by rotative drive through θy and θx.

Thus, in accordance with this embodiment, a driving mechanism is constructed for applying an adjustment in such a manner that the position C of the center of curvature of the curved-surface mirror 1 will take on a desired value, even in a case when the curved-surface mirror 1 has fluctuated from a desired position and attitude, owing to other driving components or some disturbance. As a result, an adjustment to more desirable characteristics can be achieved, while a decline in the optical characteristics of a projection optical system is effectively prevented, even during an exposure operation.

It should be noted that it is possible to adopt an arrangement in which the X, Y, Z directions are three-degrees-of-freedom for driving an optical element driving apparatus as in a second embodiment, described later. However, in a case in which the three-degrees-of-freedom is made in the X, Y, Z directions, the structure becomes a layered structure composed of a plate movable in the X and Y directions and a plate movable in the Z direction, by way of example. Such a structure has a complicated mechanism and tends to have diminished rigidity. By contrast, a driving mechanism whose three-degrees-of-freedom is Z, θx, θy, mentioned above, is such that it will suffice to dispose three Z-direction driving actuators immediately below the single layer of the mirror support plate 2. Such a mechanism is comparatively simple, and tends to assure rigidity. From this standpoint, therefore, the above-mentioned driving mechanism with the three-degrees-of-freedom Z, θx, θy is construed to be the best form conceivable at the present time.

Second Embodiment

The X, Y, Z directions may be the three-degrees-of-freedom for driving an optical element driving apparatus for performing an adjustment in such a manner that the position C(Xc, Yc, Zc) of the center of curvature of the curved-surface mirror 1 takes on a desired value.

In this case, in a manner similar to the first embodiment, the controller 7 calculates fluctuation (ΔXm, ΔYm, ΔZm, Δθxm, Δθym, Δθzm) in position and attitude of the curved-surface minor through six-degrees-of-freedom, by a coordinate transformation, based upon the values measured by the position sensors 4 that measure six or more points on the curved-surface mirror 1. Next, the controller 7 calculates fluctuation (ΔXc, ΔYc, ΔZc) in the position C of the center of curvature of curved-surface mirror 1 by a coordinate transformation from the position and attitude of the curved-surface mirror 1, through six-degrees-of-freedom. It should be noted that the fluctuation in the position C of the center of curvature may be calculated directly from measurement values of the position sensors 4 upon combining these two coordinate transformations.

Next, the controller 7 drives and controls the actuators 3 so as to compensate for fluctuation in the position C of the center of curvature by X translation of ΔXc and Y translation of ΔYc. Further, the controller 7 drives and controls the actuators 3, so as to compensate for fluctuation in the position C of the center of curvature by a Z translation with regard to ΔZc. As a result, the position C of the center of curvature of curved-surface mirror 1 is held fixed, even if the position of the curved-surface minor 1 fluctuates owing to disturbance, etc., and, therefore, the optical characteristics can be held constant.

It should be noted that the scope of application of the technique of this embodiment for controlling the position C of the center of curvature of curved-surface mirror 1 is not limited solely to a case when it is desired to restore the position of the curved-surface minor 1, which has fluctuated owing to a disturbance, etc., to the original position. For example, in a case when it is desired to move the position C of the center of curvature to a desired target position in order, for example, to achieve an adjustment to more desirable optical characteristics, a fluctuation in the directions of rotation θy, θx occurs as other driving components and the center of curvature shifts. In this case, also, in accordance with the control technique described above, the actuators 3 can be driven and controlled, so as to compensate for this positional deviation by the X and Y translations. Alternatively, even in a case when it is desired to shift the position C of the center of curvature horizontally, the position C of the center of curvature can also be shifted by performing the X and Y translations.

Third Embodiment

The Z, X directions and rotation θx about the X axis may be the three-degrees-of-freedom for driving an optical element driving apparatus for performing an adjusting in such a manner that the position C(Xc, Yc, Zc) of the center of curvature of the curved-surface minor 1 takes on a desired value.

Let (ΔXc, ΔYc, ΔZc) represent the positional deviation or other driving components of the center of curvature calculated by a coordinate transformation of the values measured by the position sensors 4. In this embodiment, the actuators 3 are driven and controlled so as to compensate for fluctuation of the position C of the center of curvature by an X translation ΔXc and rotation θx of ΔYc about the X axis. Further, the actuators 3 are driven and controlled so as to compensate for fluctuation of the position C of the center of curvature by a Z translation with regard to ΔZc.

Fourth Embodiment

The Z, Y directions and rotation θy about the Y axis may be the three-degrees-of-freedom for driving an optical element driving apparatus for performing an adjustment in such a manner that the position C(Xc, Yc, Zc) of the center of curvature of the curved-surface mirror 1 takes on a desired value.

Let (ΔXc, ΔYc, ΔZc) represent the positional deviation or other driving components of the center of curvature calculated by a coordinate transformation of the values measured by the position sensors 4. In this embodiment, the actuators 3 are driven and controlled so as to compensate for fluctuation of the position C of the center of curvature by rotation θy of ΔXc about the Y axis and a Y translation of ΔYc. Further, the actuators 3 are driven and controlled so as to compensate for fluctuation of the position C of the center of curvature by a Z translation with regard to ΔZc.

Fifth Embodiment

FIG. 3 is a diagram illustrating the structure of the optical element driving apparatus 100 according to this embodiment. The optical element driving apparatus of FIG. 3 is obtained by providing the optical element driving apparatus of FIG. 1 with a plurality of actuators 6 disposed on the underside of the curved-surface mirror 1, and arranging it so that the optical characteristics can be adjusted to more desirable characteristics by causing deformation of the reflective surface of the mirror. Examples of the actuators 3 include pneumatic bellows, linear motors, electromagnets, piezoelectric elements, magnetorestrictive elements, piezoelectric thin films formed as an integral part of the curved-surface mirror 1, or compression/decompression chambers formed in the material of the curved-surface mirror, as an integral part thereof. Higher-order optical aberration can be corrected for deforming the curved-surface mirror 1.

In such an optical element driving apparatus, there are instances where, besides a fluctuation in the center of curvature caused by a disturbance or other driving components for which a solution was contemplated in the first and second embodiments, the center of curvature shifts, as a result of deforming the curved-surface mirror 1. In this case, also, a driving mechanism and measurement control system for performing measurement in such a manner that the position C(Xc, Yc, Zc) of the center of curvature will take on the desired value can be constructed.

Specifically, in a manner similar to the first embodiment, the controller 7 calculates fluctuation (ΔXm, ΔYm, ΔZm, Δθxm, Δθym, Δθzm) in position and attitude of the curved-surface mirror 1 through six-degrees-of-freedom by a coordinate transformation based upon the values measured by the position sensors 4 that measure six or more points on the curved-surface mirror 1. Next, the controller 7 calculates fluctuation (ΔXc, ΔYc, ΔZc) in the position C of the center of curvature of curved-surface mirror 1 by a further coordinate transformation from the position and attitude of the curved-surface mirror 1 through six-degrees-of-freedom. It should be noted that the fluctuation in the position C of the center of curvature may be calculated directly from measurement values of the position sensors 4 upon combining these two coordinate transformations.

Next, the controller 7 drives the actuators 3, so as to compensate for fluctuation in the position C of the center of curvature by rotation θy of ΔXc and rotation θx of ΔYc. Further, the controller 7 drives and controls the actuators 3, so as to compensate for fluctuation in the position C of the center of curvature by a Z translation with regard to ΔZc.

Alternatively, in a manner similar to the second embodiment, the controller 7 calculates fluctuation (ΔXm, ΔYm, ΔZm, Δθxm, Δθym, Δθzm) in position and attitude of the curved-surface minor 1 through six-degrees-of-freedom by a coordinate transformation, based upon the values measured by the position sensors 4 that measure six or more points on the curved-surface minor 1. Next, the controller 7 calculates fluctuation (ΔXc, ΔYc, ΔZc) in the position C of the center of curvature of curved-surface mirror 1, by a further coordinate transformation from the position and attitude of the curved-surface minor 1, through six-degrees-of-freedom. It should be noted that the fluctuation in the position C of the center of curvature may be calculated from measurement values of the position sensors 4, upon combining these two coordinate transformations.

Next, the controller 7 drives and controls the actuators 3, so as to compensate for fluctuation in the position C of the center of curvature by X translation of ΔXc and Y translation of ΔYc. Further, the controller 7 drives and controls the actuators 3, so as to compensate for fluctuation in the position C of the center of curvature by a Z translation with regard to ΔZc.

As a result, the position C of the center of curvature of curved-surface minor 1 is held fixed, even if the position of the curved-surface minor 1 fluctuates, owing to disturbance, etc., and, therefore, the optical characteristics can be held constant.

Sixth Embodiment

In the first to fifth embodiments, the reflective surface of the curved-surface mirror 1 is assumed to be a concave spherical surface. However, the mirror may be a convex spherical mirror. Further, it is not required that the entirety be an accurate spherical surface, and it will suffice if the surface appears spherical optically in the effective area where light is reflected.

Further, the curved-surface minor 1 may be a cylindrical minor, in which the reflective surface has a concave or convex cylindrical surface. In this case, the center of curvature will be a line, rather than a single point. However, it will suffice if drive is controlled so as to move the center line of curvature to the desired position in a manner similar to that when drive is controlled in such a manner that the center of curvature assumes the desired position, in the case of a curved-surface minor.

Alternatively, the curved-surface minor 1 may be a toroidal mirror, in which the reflective surface is concave or convex and the curvature along the X direction is different from that along the Y direction. In this case, the center of curvature will be two points, depending upon the direction, and not a single point. However, it will suffice if drive is controlled in such a manner that the position of each center of curvature will be a desired position.

Furthermore, an optical element driving apparatus for adjusting the various mirror positions may further be provided with actuators for deforming the mirror.

Seventh Embodiment

An exemplary exposure apparatus, to which the optical element driving apparatus of the present invention is applied, will now be described.

Figure 5:
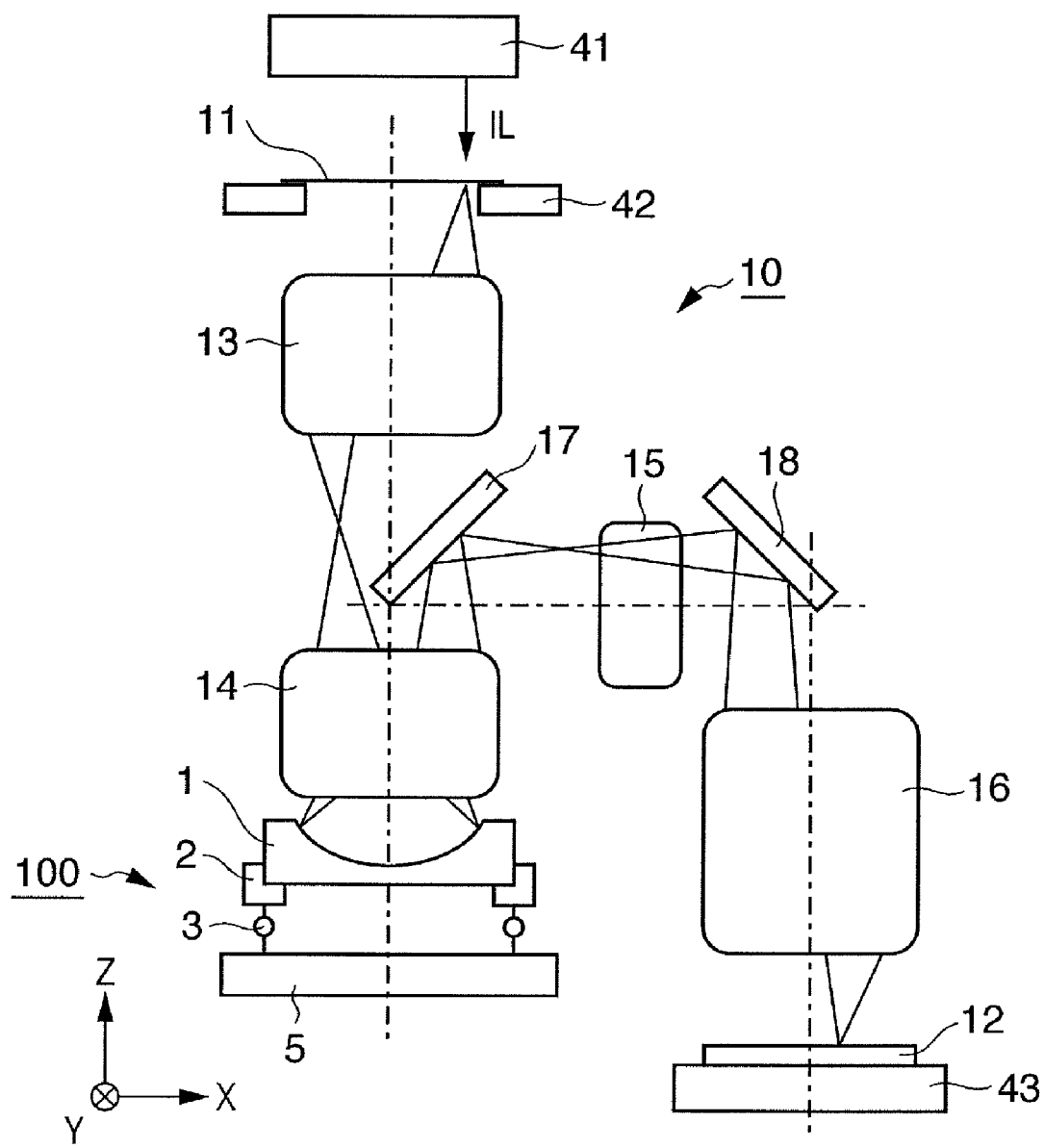
FIG. 5 is a diagram illustrating the structure of an exposure apparatus according to a seventh embodiment of the present invention.

FIG. 5 is a diagram illustrating the structure of an exposure apparatus according to this embodiment of the present invention. The exposure apparatus has an illuminating device 41, a reticle stage 42, on which a reticle 11 has been mounted, an exposure optical system 10, and a wafer stage 43, on which a wafer 12 has been mounted. The exposure apparatus projects a circuit pattern, which has been formed in the reticle 11, onto the wafer 12, to thereby perform exposure. The exposure system may be the step-and-repeat projection exposure system or the step-and-scan projection exposure system.

The illuminating device 41 illuminates the reticle 11, in which the circuit pattern has been formed, and has a light-source unit and an illuminating optical system (neither of which is illustrated). The light-source unit uses a laser as the light source. The laser can employ an ArF excimer laser having a wavelength of about 193 nm, a KrF excimer laser having a wavelength of about 248 nm, or an $F_2$ excimer laser having a wavelength of about 153 nm. Naturally, the type of laser is not limited to an excimer laser, and may be, e.g., a YAG laser, and the number of these lasers is also not limited. In a case when a laser is used as the light source, it is preferred to make use of a luminous-flux shaping optical system for shaping collimated light from the laser light source into a desired beam shape, and an optical system for making coherent laser light incoherent. Further, the light source usable in the light-source unit is not limited to a laser, and it is possible to use one or two or more lamps, such as mercury lamps or xenon lamps. The illuminating optical system is an optical system for illuminating a mask, and includes a lens, a mirror, a light integrator and a diaphragm, etc.

The exposure optical system 10 is a reflecting refractive projection optical system and includes the following, in the order traversed by the illuminating light IL from the illuminating device 41: a first lens group 13, a second lens group 14, the curved-surface mirror 1, a first deflecting mirror 17, a third lens group 15, a second deflecting mirror 18 and a fourth lens group 16. The curved-surface minor 1 is mounted in the optical element driving apparatus 100 shown in FIG. 1 or FIG. 3. Accordingly, the position of the center of curvature of the curved-surface mirror 1 is driven and adjusted in the manner described in the first to sixth embodiments set forth above.

The reticle stage 42 and wafer stage 43 are capable of being moved by a linear motor, by way of example. In the case of a skip-and-scan projection exposure system, these two stages are moved in sync with each other. Further, of the reticle stage 42 and wafer stage 43, at least one is equipped separately with an actuator, in order to align the pattern of the reticle with the wafer 12.

Such an exposure apparatus can be utilized to manufacture a semiconductor device, such as a semiconductor integrated circuit, a micromachine, or a device such as a thin-film magnetic head, on which fine patterns have been formed.

Eighth Embodiment

Figure 6:
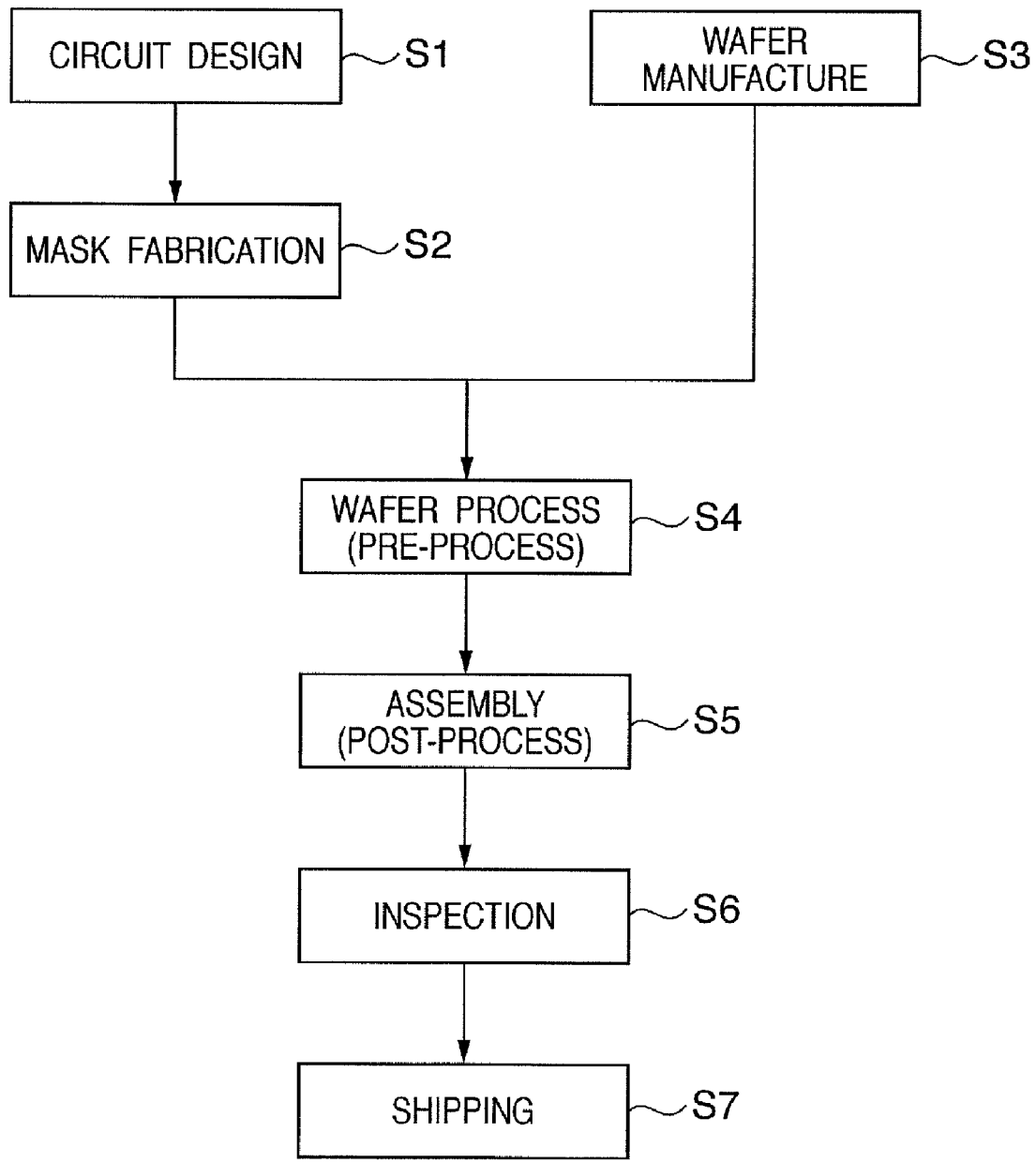
FIG. 6 is a flowchart for describing the manufacture of a device using an exposure apparatus.

Described next, with reference to FIGS. 6 and 7, will be an embodiment of a method of manufacturing a device utilizing the exposure apparatus set forth above. FIG. 6 is a flowchart illustrating the manufacture of a device (e.g., a semiconductor chip, such as an IC or an LSI, an LCD, a CCD, etc.). Here, a method of manufacturing a semiconductor chip will be described as an example.

The circuit for the device is designed at step S1 (circuit design). A mask is fabricated at step S2 (mask fabrication), based upon the circuit pattern designed. A wafer is manufactured using a material such as silicon at step S3 (wafer manufacture). The actual circuit is formed on the wafer by lithography, using the mask and wafer, by means of the exposure apparatus at step S4 (wafer process), which is also referred to as a "pre-treatment". A semiconductor chip is obtained, using the wafer fabricated at step S4, at step S5 (assembly), which is also referred to as "post-treatment". This step includes steps, such as actual assembly (dicing and bonding) and packaging (chip encapsulation). The semiconductor device fabricated at step S5 is subjected to inspections, such as an operation verification test and a durability test, at step S6 (inspection). The semiconductor device is completed through these steps, and then, is shipped (step S7).

Figure 7:
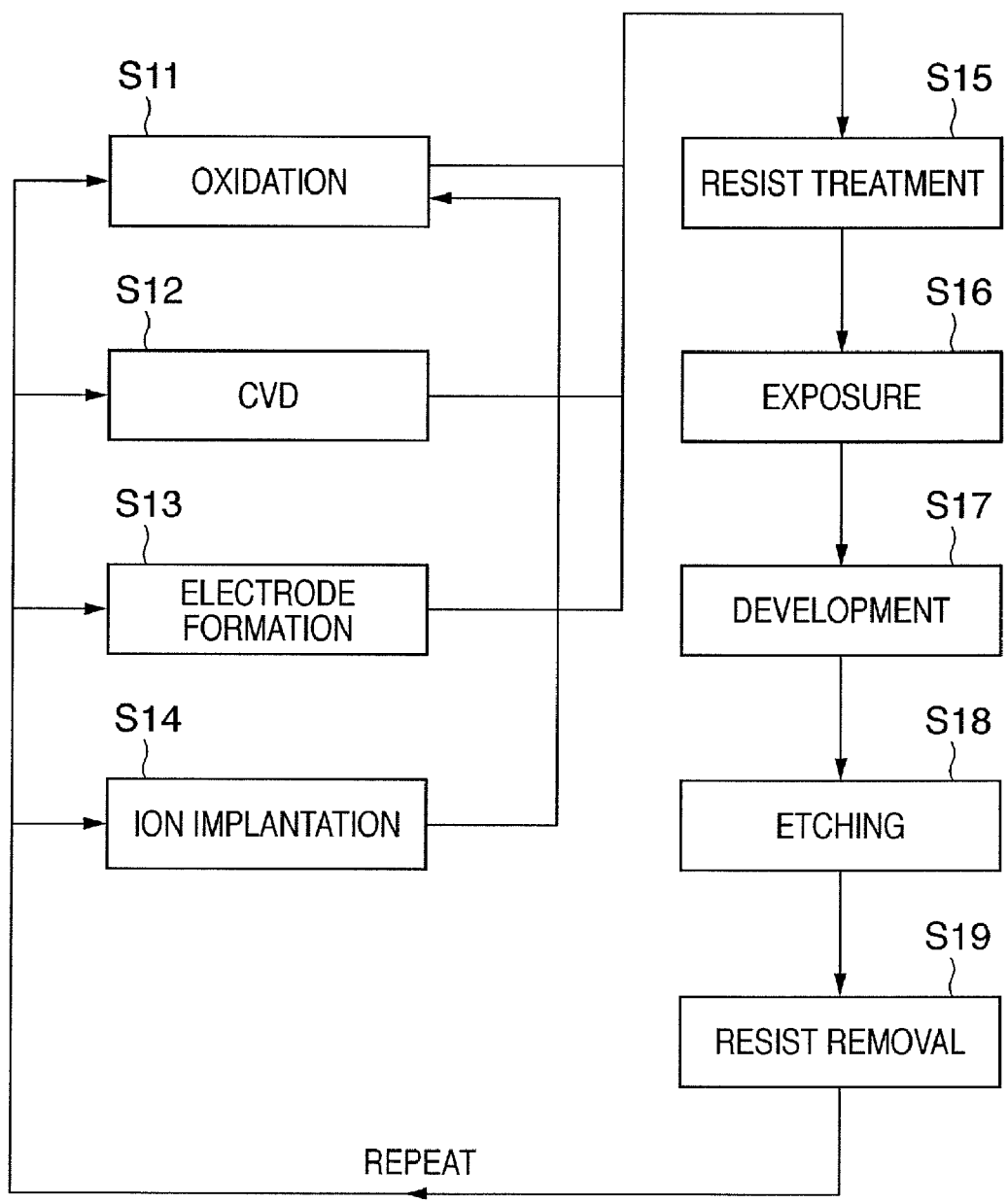
FIG. 7 is a detailed flowchart of a wafer process at a step S4 in the flowchart of FIG. 6.

FIG. 7 is a flowchart illustrating the details of the wafer process at step S4. The surface of the wafer is oxidized at step S11 (oxidation). An insulating film is formed on the wafer surface at step S12 (CVD), electrodes are formed on the wafer by vapor deposition at step S13 (electrode formation), and ions are implanted in the wafer at step S14 (ion implantation). The wafer is coated with a photoresist at step S15 (resist treatment), the wafer is exposed to the circuit pattern of the mask to print the pattern onto the wafer by the above-described exposure apparatus, at step S16 (exposure), and the exposed wafer is developed at step S17 (development). Portions other than the developed photoresist are etched away at step S18 (etching), and any unnecessary resist, left after etching is performed, is removed at step S19 (resist removal). Multiple circuit patterns are formed on the wafer by implementing these steps repeatedly.

While the present invention has been described with reference to exemplary embodiments, it is to be understood that the invention is not limited to the disclosed exemplary embodiments. The scope of the following claims is to be accorded and the broadest interpretation, so as to encompass all such modifications and equivalent structures and functions.

What is claimed is:

1. An apparatus for moving a spherical mirror, said apparatus comprising:
   at least three actuators configured to move the spherical mirror;
   at least five position sensors configured to sense the position of the spherical mirror; and
   a controller configured to calculate coordinates of a center of curvature of the spherical mirror with three-degrees-of-freedom, based on positions sensed by said at least five position sensors, and to control driving of said at least three actuators in accordance with a difference between the calculated coordinates and predetermined coordinates, so that the center of curvature of the spherical mirror is held fixed to the predetermined coordinates.

2. An apparatus according to claim 1, wherein the coordinates of the three-degrees-of-freedom are defined by a position in a direction of a Z-axis, a rotation about an X-axis and a rotation about a Y-axis, in an X-Y-Z orthogonal coordinate system.

3. An apparatus according to claim 1, wherein the coordinates of the three-degrees-of-freedom are defined by a position in a direction of a Z-axis, a position in a direction of an X-axis and a position in a direction of a Y-axis, in an X-Y-Z orthogonal coordinate system.

4. An apparatus according to claim 1, wherein the coordinates of the three-degrees-of-freedom are defined by a position in a direction of a Z-axis, a position in a direction of an X-axis and a rotation about the X-axis, in an X-Y-Z orthogonal coordinate system.

5. An apparatus according to claim 1, wherein the coordinates of the three-degrees-of-freedom are defined by a position in a direction of a Z-axis, a position in a direction of a Y-axis and a rotation about the Y-axis, in an X-Y-Z orthogonal coordinate system.

6. An apparatus according to claim 1, further comprising another actuator, which is configured to deform a reflective surface of said spherical mirror.

7. An exposure apparatus for exposing a substrate to light, said apparatus comprising:
   a spherical mirror arranged in a path of the light for directing the light to the substrate to expose the substrate; and
   an apparatus defined in claim 1 for moving the spherical mirror.

8. A method of manufacturing a device, said method comprising:
   exposing a substrate to light using an exposure apparatus defined in claim 7;
   developing the exposed substrate; and
   processing the developed substrate to manufacture the device.

9. An apparatus according to claim 1, wherein the number of actuators is three, and the number of degrees of freedom for driving the spherical mirror by the three actuators is three.

* * * * *